US007122739B2

(12) United States Patent
Franks, Jr.

(10) Patent No.: US 7,122,739 B2
(45) Date of Patent: Oct. 17, 2006

(54) UNIVERSAL GROUND STRAP ASSEMBLY

(75) Inventor: George J. Franks, Jr., Inverness, IL (US)

(73) Assignee: Senior Industries, Inc., Wood Dale, IL (US)

( * ) Notice: Subject to any disclaimer, the term of this patent is extended or adjusted under 35 U.S.C. 154(b) by 0 days.

(21) Appl. No.: 10/800,900

(22) Filed: Mar. 15, 2004

(65) Prior Publication Data

US 2004/0226734 A1 Nov. 18, 2004

Related U.S. Application Data

(63) Continuation-in-part of application No. 10/351,829, filed on Jan. 27, 2003, now Pat. No. 6,800,812, which is a continuation-in-part of application No. 09/654, 249, filed on Sep. 1, 2000, now Pat. No. 6,559,387.

(51) Int. Cl.
*H05K 5/02* (2006.01)

(52) U.S. Cl. .................... 174/51; 174/136; 174/138 E; 411/174; 439/100; 439/800

(58) Field of Classification Search .................. 174/51, 174/35 R, 136, 138 E; 411/174; 439/100, 439/800
See application file for complete search history.

(56) References Cited

U.S. PATENT DOCUMENTS

| | | | |
|---|---|---|---|
| 807,497 | A | 12/1905 | Reeve |
| 846,400 | A | 3/1907 | Cox |
| 907,542 | A | 12/1908 | Vogel |
| 972,489 | A | 10/1910 | Adams |
| 1,250,467 | A | 12/1917 | Johnson |
| 1,418,650 | A | 6/1922 | Johnson |
| 1,505,314 | A | 8/1924 | Cox |
| 1,552,932 | A | 9/1925 | Kessler |

(Continued)

FOREIGN PATENT DOCUMENTS

| | | | |
|---|---|---|---|
| CH | 150427 | A | 10/1931 |

(Continued)

OTHER PUBLICATIONS

Allied Bolt, Inc. Drop Wire Hard Ware, Product Catalog, undated, p. 37.

(Continued)

*Primary Examiner*—Hung V. Ngo
(74) *Attorney, Agent, or Firm*—Bell, Boyd & Lloyd LLC

(57) ABSTRACT

A universal ground strap assembly including a strap having a series of uniformly sized and spaced apertures to facilitate the installation of the ground strap assembly onto a wide range of structures of various shaped and sized cross-sections is provided. A stud, through which the strap is secured, includes a terminal portion adapted to accommodate and have secured therein a ground wire. The stud includes a curved surface to engage the elongated strap with smooth transition. The stud may be captivated on the strap by at least one projection extending into the hole in the strap within which the stud is held. A curved sliding nut supported upon the strap and a curved surface of the stud are used to form a tight clamping action of the strap about the structure to be grounded, without subjecting the strap to localized stresses or tearing, but permitting the strap to tightly encircle the structure. The curved sliding nut is also captivated on the strap with stops and defines a hole to receive the stud. The strap may also include an abrading surface to penetrate the outer surface layer of the structure.

17 Claims, 3 Drawing Sheets

U.S. PATENT DOCUMENTS

| | | | | | |
|---|---|---|---|---|---|
| 1,675,163 | A | | 6/1928 | Colburn | |
| 1,839,254 | A | | 1/1932 | Pearson et al. | |
| 2,061,463 | A | | 11/1936 | Hall | |
| 2,114,752 | A | | 4/1938 | Tallman | |
| 2,190,824 | A | | 2/1940 | Cook | |
| 2,210,750 | A | | 8/1940 | Cook et al. | |
| 2,423,627 | A | | 7/1947 | Tinnerman | |
| 2,532,068 | A | | 11/1950 | Larsen | |
| 2,681,196 | A | | 6/1954 | Lind | |
| 2,795,770 | A | | 6/1957 | Toedtman | |
| 3,040,477 | A | | 6/1962 | June | |
| 3,187,299 | A | | 6/1965 | Marta | |
| 3,353,145 | A | | 11/1967 | Sodderland et al. | |
| 3,562,701 | A | | 2/1971 | Orr | |
| 3,760,342 | A | | 9/1973 | Prouty et al. | |
| D233,733 | S | | 11/1974 | Byerly | |
| 4,002,869 | A | | 1/1977 | Taccetta et al. | |
| 4,026,619 | A | | 5/1977 | Gillemot | |
| 4,103,986 | A | | 8/1978 | Izraeli | |
| D269,155 | S | | 5/1983 | Rose | |
| 4,526,428 | A | | 7/1985 | Sachs | |
| 4,591,229 | A | | 5/1986 | Sachs | |
| 4,623,204 | A | | 11/1986 | Auclair | |
| 4,626,051 | A | | 12/1986 | Franks, Jr. | |
| 4,664,469 | A | | 5/1987 | Sachs | |
| 4,780,096 | A | | 10/1988 | Franks, Jr. | |
| D301,303 | S | | 5/1989 | Hoover | |
| 4,828,504 | A | | 5/1989 | Franks, Jr. | |
| 4,875,864 | A | * | 10/1989 | Campbell | 439/100 |
| 4,925,395 | A | | 5/1990 | Franks, Jr. | |
| 4,944,683 | A | | 7/1990 | Leonardo | |
| D313,392 | S | | 1/1991 | Sachs | |
| 4,993,960 | A | | 2/1991 | Franks, Jr. | |
| 5,006,074 | A | | 4/1991 | Franks, Jr. | |
| D323,973 | S | | 2/1992 | Sachs | |
| D323,974 | S | | 2/1992 | Sachs | |
| 5,131,856 | A | | 7/1992 | Auclair | |
| D331,358 | S | | 12/1992 | Sachs | |
| D335,079 | S | | 4/1993 | Sachs | |
| D342,013 | S | | 12/1993 | Sachs | |
| 5,314,343 | A | | 5/1994 | Englander | |
| 5,491,892 | A | * | 2/1996 | Fritz et al. | 29/857 |
| 5,616,036 | A | | 4/1997 | Polidori | |
| 5,642,739 | A | | 7/1997 | Fareed | |
| 5,646,370 | A | * | 7/1997 | Perkins | 174/51 |
| 5,674,079 | A | | 10/1997 | Auclair | |
| 5,768,036 | A | | 6/1998 | Nakagishi et al. | |
| 5,777,263 | A | * | 7/1998 | Maehler et al. | 174/51 |
| D398,218 | S | | 9/1998 | Coll et al. | |
| 6,011,218 | A | | 1/2000 | Burek et al. | |
| 6,322,378 | B1 | | 11/2001 | Auclair | |
| 6,398,596 | B1 | | 6/2002 | Malin | |
| 6,475,038 | B1 | | 11/2002 | Franck | |
| 6,652,295 | B1 | | 11/2003 | Glass et al. | |

FOREIGN PATENT DOCUMENTS

| | | | |
|---|---|---|---|
| DE | 373689 | C | 4/1923 |

OTHER PUBLICATIONS

Three photographs of Electric Motion ground strap UL FM 5510 DB, undated, 3 pages.

Three photographs of Sachs ground strap UL 99N9, undated, 3 pages.

Three photographs of Diamond ground strap 3C36, undated, 3 pages.

Three photographs of Allied Bolt ground clamp corresponding to U.S. Patent No. 6,398,596, 3 pages.

* cited by examiner

UNIVERSAL GROUND STRAP ASSEMBLY

CROSS-REFERENCE TO RELATED APPLICATIONS

This application is a continuation-in-part of application Ser. No. 10/351,829, filed Jan. 27, 2003 now U.S. Pat. No.6,800,812, which is a continuation-in-part of application Ser. No. 09/654,249, filed Sep. 1, 2000, now U.S. Pat. No. 6,559,387, which are hereby incorporated herein by reference in their entirety.

FIELD OF THE INVENTION

The present invention relates to electrical grounding devices and, more particularly, to a universal clamp used in facilitating ground connections with rods, pipes, or other structures of various sized and shaped cross-sections.

BACKGROUND OF THE INVENTION

In many situations, there is a need to provide an electrical connection to structures of various sized and shaped cross-sections for grounding purposes. The purpose of such a connection may be to ground electrical devices and interconnections through a connection to a cold water pipe or other suitable structure, or to ground pipes, conduit, and other structures of electrical and/or mechanical systems, in order to dissipate an electrical charge to protect such components and/or the individuals who may come into contact with these components. Grounding assemblies are commonly employed for these purposes.

Grounding assemblies come in a variety of configurations and use various means for electrically and mechanically attaching to a conductive structure. One type of assembly includes a metal strap with a plurality of holes, a metal stud, and conventional nuts to secure the strap about the periphery of the structure. More specifically, the strap encircles the structure and the stud is inserted through two of the holes to secure the strap tightly around the periphery of the conductive structure. The strap is drawn tightly around the periphery of the structure as the nuts are tightened on the stud.

The assembly typically includes a ground terminal to receive a wire for connecting the assembly to a conventional ground mechanism, such as a ground rod, or to allow the connection of a wire from an electrical device, interconnection, or system which requires grounding. In effecting such grounding, generally a ground wire is appropriately connected to a grounded structure (if the pipe or conduit must be grounded) or to a device, interconnection, or system (if the pipe or conduit will function as the grounded structure). The coupling between the ground wire to the pipe or conduit is done in a manner which ensures an effective electrical connection between the pipe or conduit and the ground wire. This coupling or connection is generally maintained free from corrosion and mechanical failure, both at the connection with the ground wire and the connection to the pipe or conduit, in order to ensure that the electrical connection therebetween is maintained.

Strap-type assemblies may accommodate different diameters of pipes or conduits, or cross-sections of differently shaped structures, such as ellipses, ovals, rectangles, and boxes. This adaptability of the strap-type assembly to a variety of conductive structures eliminates the need for an inventory of grounding assemblies that are specifically designed for a specific structure.

Strap-type assemblies generally use conventional hexagonal nuts having sharp edges to tighten the strap assembly to the conductive structure. The sharp edges of the nuts are known to gouge the metal strap as the strap is tightened at the stud. The gouging of the strap causes creases and areas of weakness which shorten the overall life of the strap and can limit the effectiveness with which it conducts electricity. The creases and/or areas of weakness may also cause the strap to break as the strap assembly is tightened around the conductive structure.

Generally, in order to install a strap-type assembly, the strap is tightened about the conductive structure to a predetermined torque to ensure that the strap is sufficiently secured to the structure, but without an excessive force being applied to the strap which could cause the strap to fail. The prior art utilization of hexagonal-shaped nuts has caused problems in this respect by making it difficult to apply the full torquing force to secure the strap onto the conductive structure. Since the curvature of the strap when attached to the conductive structure causes the strap to engage the threaded stud at an angle, the use of conventional nuts, which have an across-points dimension that is greater than the across-flats dimension of the nut, many times creates a false torque reading. Such a false reading occurs due to the manner in which the hexagonal nut engages the angled strap, whereby the larger across-points dimension causes the edges of the nut to engage the strap itself as the hexagonal nut is rotated. The contact between the hexagonal nut edge and the strap may gouge the strap, as discussed above, and requires an increased force to turn the hexagonal nut on the threaded stud, which can erroneously be interpreted as the force being applied by a torque wrench, or other torque-measuring device, between the strap and the conductive structure. Thus, such prior art devices not only damage the strap through gouging, but may also fail to sufficiently secure the strap to the conductive structure.

One solution to the problem of gouging, or otherwise providing a non-destructive tightening of the strap, is disclosed in U.S. Pat. No. 4,626,051, which issued to the same inventor as for the present invention. This patent discloses the use of two nuts, each having a curved surface for engaging the strap. The curvature of the surfaces better accepts the angle of the strap as it leaves the various structures and attaches to the stud and better distributes the force applied to the strap over a larger area. While this advancement addresses gouging of the strap by eliminating the sharp edges of engagement, at least one of the nuts must be removed from the stud during installation, and this leads to the possibility of losing the nut and/or lost time retrieving the displaced nut. This situation is compounded by the fact that many installations of strap assemblies are made in awkward and sometimes dangerous locations, such as those to suspended systems or pipes, requiring the installer to use scaffolding, catwalks, and/or ladders to reach the desired structure for attachment.

A solution to the issue of the detachment of one of the nuts is addressed in U.S. Pat. No. 6,559,387, which also issued to the same inventor as for the present invention. This patent discloses the use of a sliding nut captivated on the strap in place of one of the nuts. The sliding nut is captivated on the strap, such that the sliding nut remains secured to the strap during installation and need not be removed from the strap. However, several shortcomings remain unresolved despite this advance. Most notably, the hole for receiving the stud generally has a diameter that is larger than the diameter of the stud, such that the stud may fall out of the hole and be materially displaced or even lost prior to attachment to a conductive structure. Likewise, although the use of a captivated sliding nut is advantageous, the stud is still used to carry the second nut and can be unintentionally displaced from the assembly. Moreover, the use of a nut complicates the manufacturing of the strap assembly, since it is a separate component and must be threaded onto the stud during the manufacturing process, and also gives rise to the possibility that the nut could be lost if it is accidentally unthreaded from the stud during installation.

DETAILED DESCRIPTION OF THE PREFERRED EMBODIMENT(S)

Figure 2:
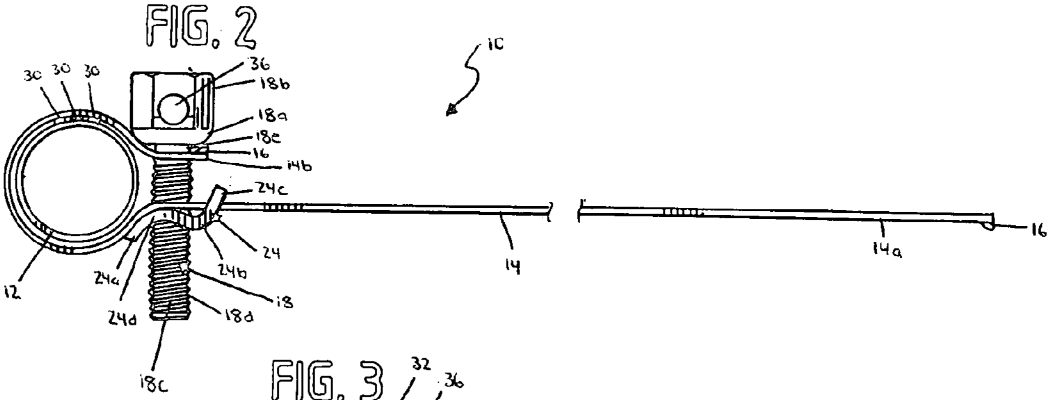
FIG. 2 is a side elevational view of the universal ground strap assembly of FIG. 1.

Referring to FIG. 2, a universal ground strap assembly 10 is illustrated in an assembled configuration with the ground strap assembly 10 secured about an exemplar conductive pipe 12. The ground strap assembly 10 may be used as a coupling for attaching a ground to a mechanical and/or electrical system comprising conduits, pipes, or other structures with various cross-sectional shapes and sizes having conductive capacity, or for an electrical device or interconnection requiring grounding. The purpose of attaching the ground strap assembly 10 is to aid in dissipating an electrical charge from the components of the system, device, or interconnection, primarily for the safety and protection of the components thereof that are not intended to carry an electrical charge and individuals who come into contact with these components.

Figure 1:
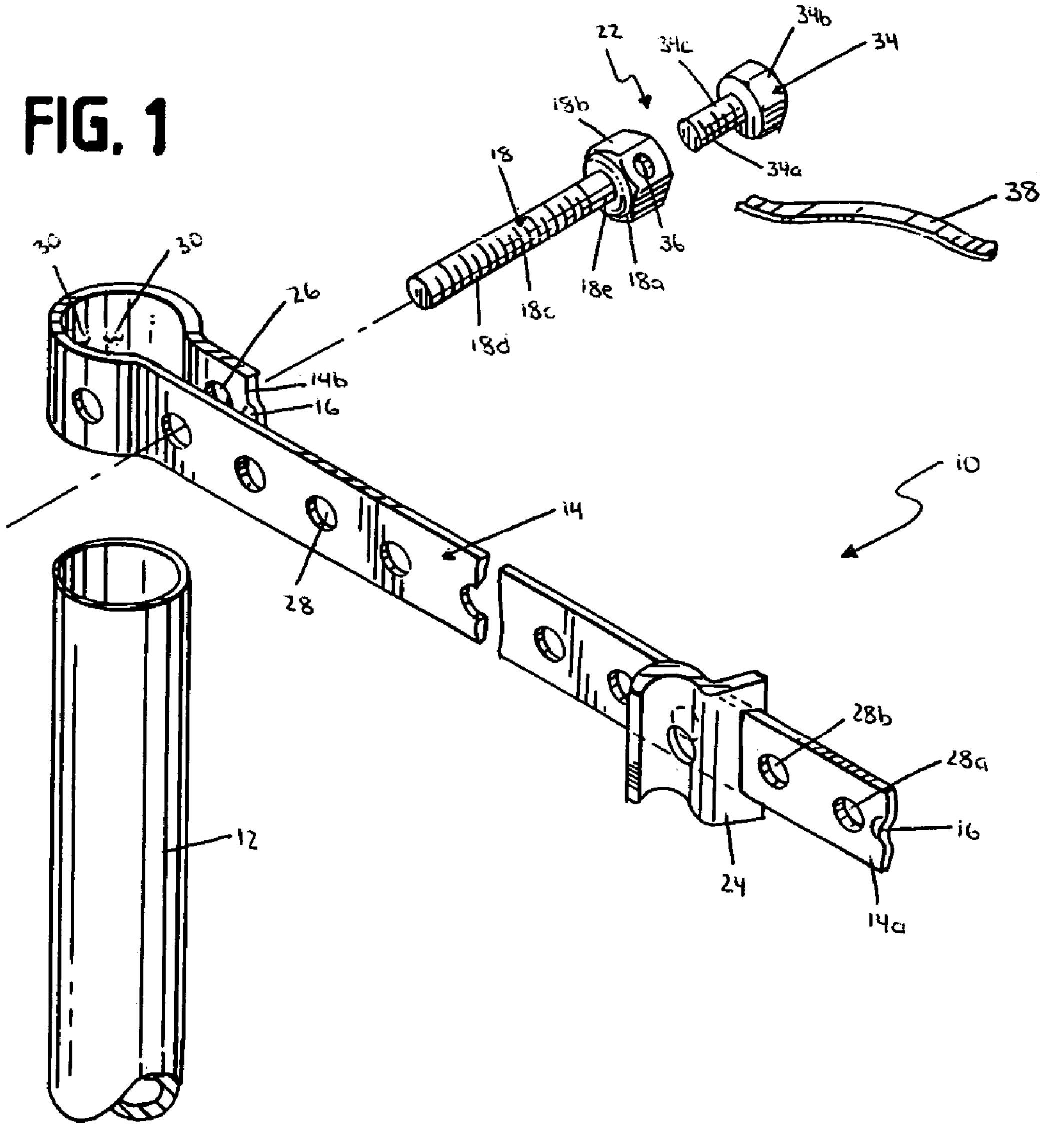
FIG. 1 is an exploded perspective view of a universal ground strap assembly having features of the present invention.

Referring to FIG. 1, the universal ground strap assembly 10 includes a strap 14 with end stops 16, a stud 18 captivated on the strap 14 by projections 20 (FIG. 5), a terminal ground wire assembly 22 at the stud 18, and a sliding nut 24 captivated on the strap 14 by the end stops 16. The stud 18 includes a curved surface 18*a* on the bottom of the head 18*b* of the stud 18 to allow the stud 18 to tightly encircle a conductive structure without subjecting the strap 14 to localized stresses and tearing without the need for a separate component, such as a curved nut, for the same purpose. The end stops 16 prevent the sliding nut 24 from sliding off the strap 14 and, thus, eliminate the possibility of losing the nut 24 during installation of the strap assembly 10. Likewise, the projections 20 prevent the stud 18 from sliding out of the stud hole 26 prior to installation and, thus, eliminate the possibility of losing or materially displacing the stud 18 from the strap 14 during installation of the strap assembly 10 or prior to installation of the strap assembly 10.

Referring to FIGS. 1 and 2, the strap 14 is elongated and relatively flexible to cover a range of different cross-sectional shapes and sizes. For example, these shapes may include circular, oval, rectangular, or square cross-sections. The length of the strap 14 may be selected according to the particular range of shapes and sizes to be accommodated. For example, with a reference to a circular cross-section, a strap of a length of about six inches may be used with a conductive structure with a diameter in the range of approximately ⅜ inch to approximately 2 inches, a strap having a length of about twelve inches may be used with a conductive structure having a diameter in the range of approximately ⅜ inch to approximately 3 and ⅜ inches, and a strap length of fourteen inches may be used with a conductive structure with a diameter in the range of approximately ⅜ inch to approximately 4 inches. For conductive structures having a diameter larger than 4 inches, a longer strap may be used or a plurality of straps may be joined together to form one ground strap assembly.

The width of the strap 14 may be any width that provides the strap 14 with strength that is sufficient to prevent or resist breakage of the strap 14 during installation. More specifically, the overall width of the strap 14 is selected according to the size of the holes 28 of the strap 14 for receiving the stud 18, such that the strength of the strap 14 at the holes 28 is sufficient to withstand the installation and tightening process with the appropriate torque without breakage. Preferably, the strap 14 has a width of approximately 0.60 inches when the holes 28 have a diameter of approximately 0.266 inches.

The strap 14 may be made of any conductive material and may have any suitable thickness that is sufficiently malleable to conform to the various shapes and sizes, yet still has enough strength to resist breakage or stretching. For example, 0.032 inch dead soft fully annealed cooper or 0.025 inch pre-galvanized steel are suitable strap materials of sufficient thickness to effectively conform to various conductive structures. The corner edges of the strap 14 may be either rounded or square, but are preferably rounded in order to reduce the potential for catching on other objects during installation or for causing injury to the installer if the installer comes into contact with the corner.

Figure 5:
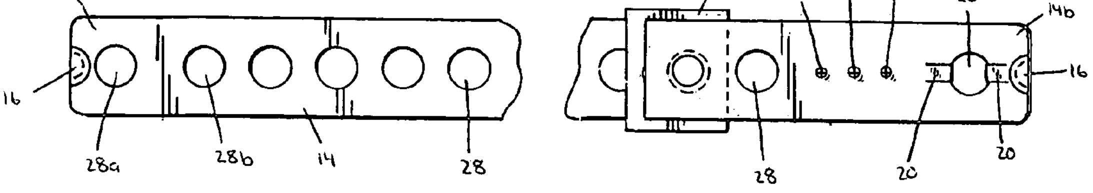
FIG. 5 is a top plan view of the strap and sliding nut of the universal ground strap assembly of FIG. 1.
Figure 6:
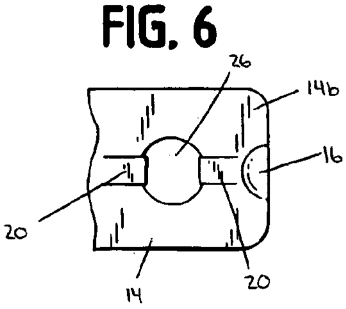
FIG. 6 is an enlarged partial top plan view of the stud aperture of the universal ground strap assembly of FIG. 1.

With reference to FIGS. 5 and 6, the strap 14 defines the stud hole 26 for receiving the stud 18 and includes the projections 20 which extend into the stud hole 26 and capture the stud 18 therein. The stud hole 18 has a diameter which is selected according to the diameter of the stud 18. For example, the stud hole may have a diameter of about 0.266 inches if a stud having an outer diameter of approximately 0.250 inches is used.

The projections 20 extend from the edges of the stud hole 26 a distance which is sufficient to secure the stud 18 therein. The projections 20 are sized such that the projections 20 radially interfere with a shank 18*c* of the stud 18, such that the stud 18 cannot fall out of the stud hole 26 prior to installation of the strap assembly 10. While the projections 20 preferably radially interfere with a threaded shank portion 18*d* of the stud 18, the projections 20 may alternatively interfere with a non-threaded shank portion 18*e* of the stud 18.

Any number of projections 20 sufficient to capture the stud 18 may be used, but preferably two opposing projections 20 are utilized. For example, the projections 20 may be in the form of two opposing rectangular projections having a width of approximately 0.100 inches and which extend beyond the edge of the stud hole 26 by approximately 0.005 inches at the edges of the projections 20 and by about 0.015 inches at the center of the projections 20. The projections 20 may be formed in any way known in the art, but are preferably formed by shear cutting the projections 20 from the strap 14.

The stud 18 may be inserted into the stud hole 26 and captured by the projections 20 in any way known in the art. For example, the projections 20 may be formed in a horizontal orientation (i.e. aligned with the surface of the strap 14) and the stud 18 may be threaded into the stud hole 26 such that the projections 20 thread into the threaded shank 18*d* of the stud 18 a distance sufficient to capture the stud 18. Thus, the stud 18 is captured within the stud hole 26 by the projections 20, but may be released from the stud hole 26 by unthreading the stud 18 from the projections 20 should the need arise. Alternatively, the projections 20 may be formed to have an inclined or declined orientation out of the plane of the remainder of the strap 14 about the stud hole 26, such that the stud 18 may be inserted into the stud hole 26 in clearance from the projections 20, and then the projections 20 may be bent or stamped downward or upward, respectively, to capture the stud 18.

While it is preferable to capture the stud 18 with the projections 20 in such a way that the stud 18 may be unthreaded from the stud hole 26 should it be necessary to do so, the stud 18 may also be captured in such a way that it cannot be unthreaded from the stud hole 26. However, in either event, the projections 20 should not interfere with the ability of the stud 18 to thread into the sliding nut 24, thereby tightening the strap assembly 10 around the conductive structure. Thus, the projections 20 preferably radially interfere with the shank 18*c* of the stud 18 in such a way that the stud 18 cannot fall out of the stud hole 26 prior to the installation of the strap assembly 10, but that allow the stud 18 to be rotated and threaded into the sliding nut 24 to tighten the strap 14 around the conductive structure.

As illustrated in FIGS. 1 and 5, to accommodate different shapes and sizes the strap 14 includes a plurality of spaced holes 28 along a longitudinal axis of the strap 14. The diameter of the holes 28 may vary according to the diameter of the shank portion 18*c* of the stud 18, such that the holes 28 may receive the shank portion 18*c* of the stud 18. Preferably, the holes 28 are sized such that the stud 18 may be freely received therein. That is, holes 28 are sized such that the outer diameter of the stud 18 may be in slight clearance with the edge of the holes 28 when the stud 18 is received therein. For example, the diameter of the holes 28 may be about 0.266 inches to accommodate a shank 18*c* with a diameter of about 0.25 inches. Alternatively, the diameter of the holes may be sized such that the outer edges of the holes threadably engage the stud when the stud is received by the holes, such that the stud may be threaded into the holes.

The holes 28 of the strap 14 are preferably spaced at equal distances from each other along the longitudinal axis of the strap 14. More preferably, the holes 28 are equally spaced along the longitudinal axis of the strap 14 and are separated by 0.40 inches on center. Optionally, the spacing of the holes 28 may be related to the length of the stud 18. That is, the distance between each adjacent hole may be such that it is not greater than the length of the shank portion 18*c* of the stud 18. This relationship between the stud 18 and the spacing of the holes 28 of the strap 14 enables the strap assembly 10 to accommodate intermediate cross-sections between the hole spacings. However, the holes need not be equally spaced and any desired spacing may be used.

However, alternative spacing schemes may be used to space the holes 28*a*, 28*b* adjacent an end 14*a* of the strap 14 opposite the stud hole 26. For example, the spacing between the end holes 28*a*, 28*b* may be larger. That is, the distance between the first hole 28*a* and the second hole 28*b* and the distance between the other holes 28 in general may be larger. This enables the strap 14 to be designed to fit a particular cross-section size at the upper end of the range for the particular strap. For example the spacing between the first hole 28*a* and the second hole 28*b* may be about 0.546 inches on center, while the distance between the other holes 28 may be about 0.40 inches on centers.

The number of holes 28 in the strap 14 may be selected according to the length of the strap 14. As the length of the strap increases, the number of holes included therein also increases. For example, a strap having a length of approximately 6 inches may include eleven holes, a strap with a length of approximately 9 inches may include twenty-one holes, and a strap having a length of approximately 12 inches may include twenty-seven holes.

In addition, for mid-range sizes, the segment of the strap 14 adjacent the stud 18 and the stud hole 26 is usually wrapped around the conductive structure, and thus, this segment of the strap 14 need not include holes. Preferably, in the place of holes, the segment of the strap 14 adjacent the stud 18 and stud hole 26 includes an abrasive surface for engaging the conductive structure. In particular, the abrasive surface is provided in order to allow the strap 14 to form an electrical connection between the strap 14 and the conductive structure when the conductive structure is covered by paint and/or corrosion. However, this segment may alternatively contain no additional structure and may form only a segment of the strap without holes.

The abrasive surface may take on any suitable structure that makes it sufficiently abrasive to penetrate an outer layer, such as paint or corrosion. For example, the abrasive surface is preferably in the form of a plurality of pierced projections 30 formed by punching small holes through the strap 14, leaving the torn and jagged projections 30 extending from the surface of the strap 14. The projections 30 are preferably formed by punching through the strap 14 with a pointed object having a small diameter. The pointed object may have a variety of shapes, but preferably has an X-shape or pyramid shape, as these shapes produce the desired torn and jagged projections 30. For example, the pointed object may be a sharp X-shaped or pyramid-shaped point having a diameter or width of approximately 0.0625 inches. However, any method known in the art may be used to create the pierced projections, so long as the method leaves torn and jagged surfaces to engage the conductive structure.

The plurality of projections 30 may include any number of projections disposed in any pattern which is sufficient to abrade through a layer of paint and/or corrosion on the conductive structure as the strap 14 is tightened thereon. For example, the plurality of projections 30 may include three projections 30 aligned along the longitudinal axis of the strap 14 and separated by approximately 0.1875 inches on center. However, a variety of different forms for the plurality of projections may be used, for example, having different numbers of projections, different sizes, different configurations of the projections, and different spacings of the projections.

Figure 3:
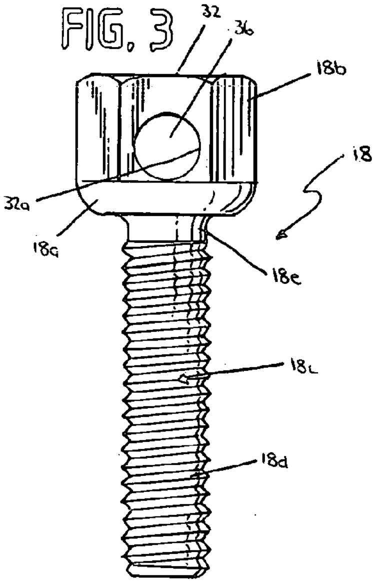
FIG. 3 is a side elevational view of the stud of the universal ground strap assembly of FIG. 1.

As seen in FIGS. 1–3, the stud 18 preferably includes the head 18*b* and the shank portion 18*c*, which includes the threaded shank portion 18*d*. Preferably, the head 18*b* has a hexagonal shape in order to ease the installation of the ground strap assembly 10, but the head 18*b* alternatively may have any shape for a stud head known in the art. Optionally, the head 18*b* may include structure to allow the use of tools, such as screwdrivers, wrenches, and other tools, with the head 18*b*.

The threaded shank portion 18*c* may include any type of threads desired, but preferably includes ¼-20 2A threading. The threaded shank portion 18*d* may have any length which is sufficient to allow the strap assembly 10 to be used with a variety of differently sized and shaped conductive structures, but preferably the threaded shank portion 18*d* has a length of approximately 1.0 inches. Optionally, the stud 18 may also include the short non-threaded shank portion 18*e* adjacent the head 18*b*. The non-threaded shank portion 18*e* preferably may have a diameter of approximately 0.21 inches and an axial length of approximately 0.060 inches. The threaded shank portion 18*d* extends below the head 18*b*, as well as the non-threaded shank portion 18*e* if included, and axially along the longitudinal axis of the stud 18. The stud 18 be made of any conductive material, but is preferably made of brass copper alloy, steel with nickel plating, or brass, or, more preferably, is made of free machine brass copper alloy number 360.

The head 18*b* of the stud 18 includes the curved surface 18*a* that permits the strap 14 to tightly encircle the conductive structure without subjecting the strap 14 to localized stresses or tearing. That is, the curved surface 18*a* of the head 18*b* of the stud 18 allows the stud 18 to smoothly be threaded into the sliding nut 24 to tighten the strap 14 around the conductive structure, without gouging the strap 14 or producing false torque readings. The curved surface 18*a* is a smooth surface having a radius of curvature sufficient to better accept the angle of the strap 14 as it leaves the conductive structure and to better distribute the force applied to the strap 14 over a larger area. That is, the radius of curvature of the curved surface 18*a* must be sufficient such that the sharp points of the head 18*b* do not contact or adversely effect the strap 14 as the strap assembly 10 is tightened onto the conductive structure. For example, the curved surface 18*a* may have a radius of curvature of approximately 0.10 inches.

The curved surface 18*a* of the stud 18 may be formed in any way known in the art. For example, the stud 18 may be formed with a head 18*b* including the curved surface 18*a*, or the curved surface 18*a* may be formed by taking a standard stud and removing material from the head 18*b* using grinding or other similar machining procedures or techniques to form the desired curved surface 18*a*.

The head 18*b* of the stud 18 preferably includes the terminal ground wire assembly 22. The top of the head 18*b* defines a hole 32 coaxial with the longitudinal axis of the stud 18. The hole 32 includes internal threads 32*a* to accommodate external threads 34*a* of a ground wire stud 34, as part of the terminal ground wire assembly 22. The hole 32 may be of any size sufficient to accept a suitable ground wire stud 34, yet is sufficiently small such that the strength of the head 18*b* of the stud 18 is not unnecessarily compromised. For example, the hole 32 may be a ¼-20 tap hole with full internal threads having a depth of approximately 0.260 inches when a stud head 18*b* having an across-points dimension of about 0.502 inches, an across-flats dimension of about 0.435 inches, and a head depth of about 0.411 inches is used.

The terminal ground wire assembly 22 includes the ground wire stud 34 with the external threads 34*a* configured to mate with the internal threads 32*a* lining the internally threaded hole 32. The ground wire stud 34 may include a head 34*b* and a threaded shank 34*c*. Preferably, the head 34*b* has a hexagonal shape in order to ease the rotation of the ground wire stud 34, but the head 34*b* may alternatively have any shape for a head known in the art. The head 34*b* may also include any structure that facilitates use with tools to rotate the ground wire stud 34. For example, the head 34*b* of the ground wire stud 34 may include a slot for accepting the end of a flat screwdriver or an X-shaped cutout for receiving the end of a Philips-type screwdriver. The ground wire stud 34 may be made of any conductive material, but is preferably made from nickel plated steel or plain brass.

The threaded shank 34*c* includes threads 34*a* which correspond to the interior threads 32*a* of the threaded hole 32 of the stud 18. For example, the ground wire stud 34 may include ¼-20 2A threading when the hole 32 includes a ¼-20 tap. The threaded shank 34*c* of the ground wire stud 34 may have any length sufficient to secure a ground wire 38 to the ground terminal wire assembly 22, but preferably has a length of approximately 0.343 inches.

Preferably, the ground wire stud 34 may include a frusto-conical end portion 34*d*, wherein the end of the ground wire stud 34, including the last several threads of the ground wire stud 34, have a reducing diameter relative to the remainder of the threaded shank 34*c* of the ground wire stud 34. For example, where ¼-20 2A threading is used on the threaded shank 34*c* of the ground wire stud 34, the end portion 34*d* may have a minimum outer diameter of 0.170 inches. The end portion 34*d* may have any rate of diameter reduction, but preferably has a reduction rate that can be measured as the angle relative to a longitudinal axis 34*e* of the ground wire stud 34 to be an angle in the range of approximately 20–22.5 degrees. The frusto-conical end portion 34*d* aids in the insertion of the ground wire stud 34 into the hole 32 of the stud 18.

The head 18*b* of the stud 18 also defines a bore 36 extending transversely to the longitudinal axis of the stud 18 and passing completely through the stud head 18*b*. The bore 36 is shaped to accept a stranded or solid ground wire 38 of various gauges, such as those in at least a range of 6 to 14 AWG. The bore 36 may be round or elongated to accommodate larger diameter wires. For example, the bore 36 may be a round hole having a diameter of approximately 0.190 inches.

The internally threaded hole 32 is generally perpendicular to the bore 36. That is, the threaded hole 32 forms a "T" with the bore 36. Preferably, the bore 36 is located such that it intersects the bottom of the hole 32 of the stud 18. For example, if the hole 32 of the stud 18 has a depth of 0.260 inches, the center axis of the bore 36 may be located 0.215 inches from the top surface of the head 18*b* of the stud 18. Thus, when the ground wire 38 is inserted into the bore 36, the ground wire stud 34 may be threaded into the threaded hole 32 until it engages the ground wire 38 and clamps the ground wire 38 against the bottom of the bore 36.

The combination of the ground wire stud 34, the head 18*b* of the stud 18, the internally threaded hole 32, and the bore 36 result in the use of compressive forces to secure the ground wire 38 to the stud 18. By tending to eliminate stresses that result from other connection methods, such as those applied when the ground wire 38 is wrapped around a ground post, the conductive capacity of the ground wire 38 is less likely to be reduced because of the reduced chance for the wire to be frayed or split by the shearing stress such a connection may cause. However, while the above described ground wire connection method to connect the ground wire to the ground strap assembly is preferred, other methods of connecting the ground wire to the ground strap assembly are contemplated here.

Figure 7:
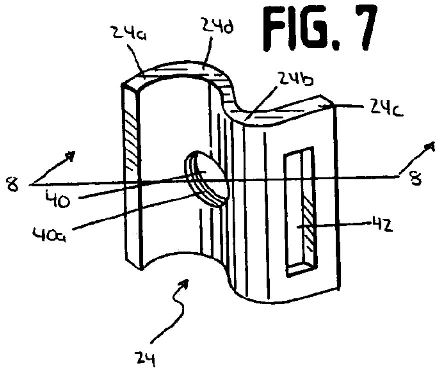
FIG. 7 is a perspective view of the sliding nut of the universal ground strap assembly of FIG. 1.
Figure 8:
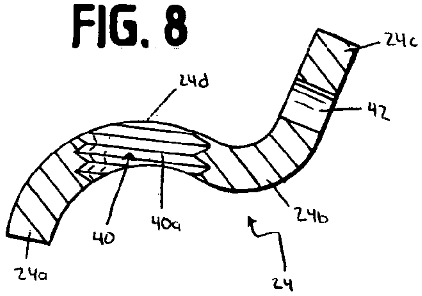
FIG. 8 is a sectional view of the sliding nut of the universal ground strap assembly of FIG. 1 taken along line 8—8 of FIG. 7.
Figure 9:
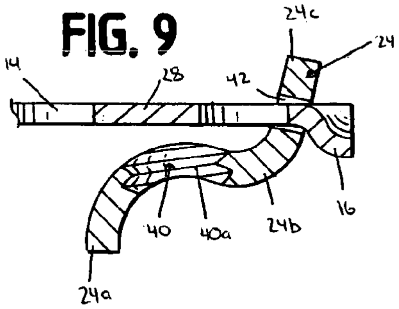
FIG. 9 is a partial sectional view of the strap and sliding nut of the universal ground strap assembly of FIG. 1 when the sliding nut is shifted adjacent the free end of the strap.

As shown in FIGS. 7–9, the sliding nut 24 has a multiple curved shape with a first curved portion 24*a*, a second curved portion 24*b*, and a third generally straight portion 24*c*. The sliding nut 24 may have any thickness sufficient to provide the sliding nut 24 with strength sufficient for the sliding nut 24 to resist deformation, but preferably the sliding nut 24 has a thickness of approximately 0.075 inches. The sliding nut 24 may be made of any conductive material, but is preferably constructed of nickel plated steel.

The first curved portion 24*a* defines a threaded bore 40 that receives and cooperates with the threaded shank portion 18*d* of the stud 18. The threaded bore 40 includes internal threads 40*a*, such that the threaded shank 18*d* of the stud 18 may be received and threaded therein. The straight portion 24*c* of the sliding nut 24 defines a slot 42 through which the strap 14 may extend to allow the sliding nut 24 to slide along the strap 14. The second curved portion 24*b* of the sliding nut 24 positions the slot 42 such that the strap 14 is above the bore 40 of the first curved portion 24*a*. This positioning enables a straight alignment with the holes 28 of the strap 14.

More specifically, the radius of curvature of the first curved portion 24*a* of the sliding nut 24 must be such that the first curved portion 24*a* may contact a portion of the strap 14 coming off the conductive structure in a manner to ensure a smooth transition, so as to minimize or even eliminate any localized stress points on the strap 14, such as sharp bends, which may create points of weakness. For example, the radius of curvature of the first curved portion 24*a* may be about 0.250 inches.

The first curved portion 24*a* of the sliding nut 24 defines the bore 40 for receiving the stud 18. The bore 40 is centered about a peak 24*d* of the first curved portion 24*a*. The bore 40 includes internal threads 40*a* that extend between the convex side and the concave side and are sized to mate with the threaded shank portion 18*d* of the stud 18. For example, the bore 40 may include a ¼-20 tap when a stud 18 having ¼-20 2A threading is used. The bore 40 includes a number of threads 40*a* sufficient to secure the stud 18 within the bore 40.

The height and width of the slot 42 of the sliding nut 24 should be greater than the thickness of the strap 14, yet less than the depth of the stops 16, and the width of the strap 14, respectively, to allow the sliding nut 24 to slide freely along the strap 14 while prohibiting the passage of the sliding nut 24 over the stops 16. For example, if the strap 14 is made of 0.032 annealed copper and has a width of about 0.60 inches with stops 16 having a depth of about 0.10 inches, the slot 42 may have a height of approximately 0.080 inches and a width of approximately 0.630 inches. Additionally, the extension of the strap 14 through the slot 42 of the sliding nut 24 also aids in the installation of the ground strap assembly 10, since the presence of the strap 14 within the slot 42 substantially prevents the sliding nut 24 from rotating relative to the strap 14 as the stud 18 is threaded into the threaded bore 40.

Figure 4:
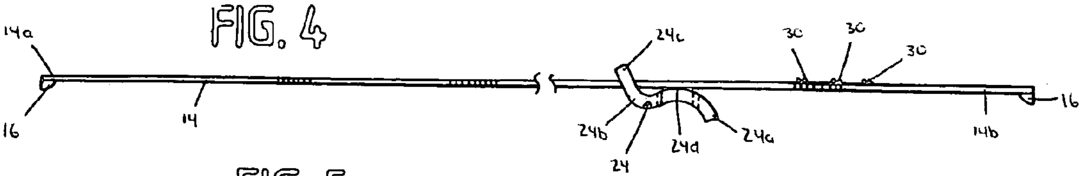
FIG. 4 is a side elevational view of the strap and sliding nut of the universal ground strap assembly of FIG. 1.
Figure 10:
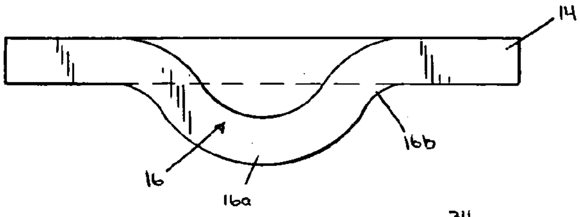
FIG. 10 is a side elevational view of the strap of the universal ground strap assembly of FIG. 1.
Figure 11:
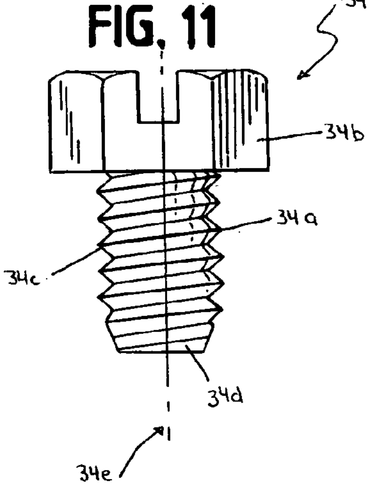
FIG. 11 is a side elevational view of the ground wire stud of the universal ground strap assembly of FIG. 1.

With reference to FIGS. 4–5 and 10, the strap 14 includes end stops 16 to captivate the sliding nut 24 to prevent inadvertent loss during installation of the strap assembly 10. Although the strap 14 is illustrated with stops 16 at both ends, having only the stop at the free end 14*a* of the strap 14 (the end opposite the stud hole 26 and stud 18) would be sufficient because the stud 18 may effectively act as a stop on the stud hole end 14*b* of the strap 14.

As illustrated best in FIG. 10, the stops 16 may take the shape of a raised partial dimple. More specifically, each of the stops 16 has a center portion 16*a* symmetrically curved about the longitudinal centerline of the strap 14 with a major radius of curvature and a pair of smoother curved segments 16*b* extending from the center portion 16*a* to the strap 14 with a second radius of curvature. For example, the major curvature of the center portion 16*a* may have a radius of about 0.10 inches and a depth of about 0.10 inches. The curved segments 16*b* may have a radius of curvature of about 0.031 inches. However, the illustrated stops 16 are only one example of a stop shape contemplated. For example, the stops may include a plurality of dimples, folded portions of the strap, or any other acceptable form for a stop. Although the stops 16 illustrated herein are formed integral to the strap 14, such as by conventional stamping or metal bending techniques, the stops may also be formed using separate components. For example, small protrusions, rivets, screws, tabs, studs, welds, or any other obstruction at the end of the strap to prevent the release of the sliding nut may be used.

To install the ground strap assembly 10, the strap 14 is wrapped around a conductive structure, such as the illustrated pipe 12. The ground strap assembly 10 is manually bent or tightened around the structure until one of the holes 28 of the strap 14 lines up with the shank 18*c* of the stud 18. The sliding nut 24 may then be slid into position under the aligned hole, such that the bore 40 of the sliding nut 24 is in registration with the hole in the strap 14 and the shank 18*c* of the stud 18. The stud 18 is then inserted through the hole of the strap 14 and turned into the threaded bore 40 of the sliding nut 24 to draw the strap 14 tightly around the pipe 12. A conventional tool, such as a wrench, pliers, vice grips, or torque wrench may be used with the head 18*b* of the stud 18 as appropriate to obtain the desired degree of tightness for the strap 14 about the pipe 12.

The ground wire stud 34 is turned or loosened to open the bore 36 of the stud 18 for a ground wire 38. A ground wire 38, which may be in the form of a bare wire or a wire with insulation removed from the end, is then inserted into the bore 36 of the head 18*b* of the stud 18 to form an electrical connection between the ground wire 38 and the terminal ground wire assembly 22. After the ground wire 38 is inserted into the bore 36, the ground wire stud 34 is tightened by rotation to secure the ground wire 38 within the bore 36 by compressive force. The ground wire 38 may then be attached to an acceptable ground mechanism (if the conductive structure requires grounding), or may be attached to an electrical device, system, or interconnection in need of grounding if the ground strap assembly 10 is attached to a grounding structure. Thus, the ground strap assembly 10 forms an electrical connection between the ground wire 38 and the conductive structure, such as the illustrated pipe 12.

While the invention has been described in the specification and illustrated in the drawings with reference to preferred embodiments, it will be understood by those skilled in the art that various changes may be made and equivalents may be substituted for elements thereof without departing from the scope of the present invention as defined in the appended claims. In addition, many modifications may be made to adapt a particular situation or material to the teachings of the invention, as defined in the appended claims, without departing from the essential scope thereof. Therefore, it is intended that the present invention not be limited to the particular embodiments illustrated by the drawings and described in the specification as the best modes presently contemplated for carrying out the present invention, but that the present invention will include any embodiments falling within the description of the appended claims.

What is claimed is:

1. A universal ground clamp for structures with different cross-sectional shape, comprising:

an elongated strap defining at least a first hole and a second hole; and a securing stud mechanism to extend through at least the first hole and the second hole to attach the elongated strap about the structure, the securing stud mechanism including a stud having a curved surface to engage the elongated strap with a smooth transition;

the stud including a head and a shank, wherein the head includes the curved surface;

the elongated strap including an abrasive surface for engaging an electrically conductive structure;

wherein the stud is captured by at least the first hole and the stud is capable of being received by the second hole after the elongated strap has been positioned about at least a portion of an electrically conductive structure; and wherein the first hole includes at least one projection extending into the first hole and the stud is captured within the first hole by the at least one projection.

2. An electrical connector in accordance with claim 1, wherein the at least one projection is integral to the elongated strap.

3. An electrical connector in accordance with claim 2, wherein the at least one projection has a rectangular shape and extends from the perimeter of the first hole and into the first hole.

4. An electrical connector in accordance with claim 1, wherein the at least one projection radially interferes with the stud and thereby captures the stud within the first hole.

5. An electrical connector in accordance with claim 4, wherein the stud includes a head and a shank and the at least one projection radially interferes with the shank.

6. An electrical connector in accordance with claim 5, wherein the shank includes a threaded portion and the at least one projection radially interferes with threads of the threaded portion.

7. An electrical connector in accordance with claim 5, wherein the shank includes a threaded portion and a non-threaded portion located between the head and the threaded portion and the at least one projection radially interferes with the non-threaded portion.

8. A universal ground clamp for structures with different cross-sectional shape, comprising:

an elongated strap defining at least a first hole and a second hole; and a securing stud mechanism to extend through at least the first hole and the second hole to attach the elongated strap about the structure, the securing stud mechanism including a stud having an integral curved surface to engage the elongated strap with a smooth transition, wherein the integral curved surface rotates synchronously with the securing stud mechanism;

the stud including a head and a shank, wherein the head includes the curved surface;

wherein the stud is captured by at least the first hole and the stud is capable of being received by the second hole after the elongated strap has been positioned about at least a portion of an electrically conductive structure; and wherein the securing stud mechanism includes a sliding curved nut slidingly supported on the elongated strap.

9. An electrical connector in accordance with claim 8, wherein the elongated strap includes at least one ends stop and the sliding curved nut is maintained on the elongated strap by the at least one stop.

10. An electrical connector in accordance with claim 9, wherein the stud defines a hole coaxial with the longitudinal axis of the stud.

11. An electrical connector in accordance with claim 10, wherein the head defines a bore extending transversely to the longitudinal axis of the stud for receiving a ground wire.

12. An electrical connector in accordance with claim 11, wherein the bore extends completely through the head.

13. An electrical connector in accordance with claim 12, wherein the hole extends into the bore.

14. An electrical connector in accordance with claim 13, wherein the electrical connector includes a second stud and the hole receives the second stud.

15. An electrical connector in accordance with claim 14, wherein the second stud may be rotatably shifted from a wire receiving position to a wire securing position.

16. An electrical connector in accordance with claim 15, wherein the bore may receive a wire when the second stud is in its wire receiving position and a wire may be secured therein when the second stud is in its wire securing position.

17. An electrical connector in accordance with claim 14, wherein the second stud includes a frusto-conical end portion.

* * * * *